United States Patent [19]

Jeter et al.

[11] Patent Number: 4,859,808

[45] Date of Patent: Aug. 22, 1989

[54] ELECTRICAL CONDUCTOR HAVING UNIQUE SOLDER DAM CONFIGURATION

[75] Inventors: Michael A. Jeter, Kokomo, Ind.; Joseph S. Capurso, Waltham, Mass.

[73] Assignee: Delco Electronics Corporation, Kokomo, Ind.

[21] Appl. No.: 212,446

[22] Filed: Jun. 28, 1988

[51] Int. Cl.⁴ .............................................. H05K 3/34
[52] U.S. Cl. .................................. 174/68.5; 228/118; 228/180.2; 361/406; 361/404
[58] Field of Search ............................ 174/68.5, 52.4; 361/404, 406, 409; 228/118, 179, 180.1, 180.2

[56] References Cited

U.S. PATENT DOCUMENTS

| | | | |
|---|---|---|---|
| 3,567,844 | 3/1971 | Kremar | 361/409 X |
| 3,610,811 | 10/1971 | O'Keefe | 174/68.5 |
| 3,777,221 | 12/1973 | Tatusko | 228/118 X |
| 4,303,291 | 12/1981 | Dines | 174/68.5 X |
| 4,326,239 | 4/1982 | Ohsawa et al. | 174/68.5 X |
| 4,413,309 | 11/1983 | Takahashi et al. | 174/68.5 X |
| 4,584,039 | 4/1986 | Shea | 174/68.5 X |
| 4,590,539 | 5/1986 | Sanjana et al. | 174/68.5 X |
| 4,638,116 | 1/1987 | Gumb | 174/68.5 |
| 4,694,121 | 9/1987 | Ota | 174/68.5 |
| 4,706,167 | 11/1987 | Sullivan | 174/68.5 X |
| 4,728,022 | 3/1988 | Jamison | 228/180.2 X |
| 4,766,268 | 8/1988 | Uggowitzer | 174/68.5 |
| 4,767,892 | 8/1988 | Kobari | 174/68.5 |

OTHER PUBLICATIONS

L. F. Miller, Controlled Collapse Reflow Chip Joining, IBM J. Res. Develop., May 1969, pp. 239-249.

*Primary Examiner*—R. R. Kucia
*Attorney, Agent, or Firm*—Domenica N.S. Hartman

[57] ABSTRACT

An electrical interconnection lead pattern for connecting an integrated circuit to an electrical circuit comprises a plurality of electrical conductors and a plurality of non-continuous dielectric regions. Each conductor has a contact region wherein the conductor is subsequently electrically connected to a predetermined region on the integrated circuit. In addition, each of the contact regions are substantially parallel with respect to each and every other contact region. The dielectric regions comprise a material not amenable to soldering and are substantially parallel with respect to each and every other dielectric region so that the non-continuous regions between the dielectric regions are also substantially parallel. Lastly, the contact regions are substantially perpendicular with respect to each and every dielectric region, and disposed such that a portion of each of the contact regions contacts a portion of the non-continuous region between the dielectric regions and a portion of the dielectric region. This conductor pattern provides a high tolerance for misalignment between the contact regions, the dielectric regions, and the contacted regions of the integrated circuit without detrimental effects to the integrity of the resulting electrical connection.

7 Claims, 3 Drawing Sheets

ELECTRICAL CONDUCTOR HAVING UNIQUE SOLDER DAM CONFIGURATION

This invention relates to the design of electrical interconnection leads for electrically connecting an integrated circuit to an electrical circuit on a substrate, which is compatible with conventional thick and thin film technologies, tape automated bonding techniques and flexible circuitry techniques. More particularly, this invention relates to electrical interconnection leads having a unique solder dam configuration which tolerates substantial misalignment in the area of electrical connection without degradation in electrical connection integrity.

BACKGROUND OF THE INVENTION

Electrical interconnections are required for electrically connecting an integrated circuit to the electrical circuit on the supporting substrate. Typically, the integrated circuit has small solder balls or "bumps" attached to those regions where electrical contact will be made. The integrated circuit is then positioned such that the bumps contact the electrical circuit on the supporting substrate in the appropriate regions.

In addition to the conventional thick and thin film technologies wherein the electrical circuit is printed or deposited onto the surface of a supporting substrate so as to form the patterned circuitry, many methods are known for forming the electrical interconnections between an integrated circuit and the electrical circuit on a supporting substrate. Tape automated bonding (TAB) is one commonly known method for forming these such electrical interconnections. A TAB tape is provided which comprises a plurality of individual long, slender inner leads attached to, and extending out from, generally wider, larger outer leads. There may be many of these inner/outer lead configurations on a single TAB tape.

An individual inner lead on the TAB tape is bonded to the integrated circuit at a bonding pad, so as to form an inner lead bond. There are generally many of these inner lead bonds on a single integrated circuit. The inner lead bonds are typically formed by first depositing a gold bump, or other suitable material, on the integrated circuit itself at the appropriate electrical connection points. The integrated circuit and TAB tape inner leads, which are generally copper, are then aligned and simultaneously thermocompression gang bonded.

After bonding between the integrated circuit and inner leads is complete, the integrated circuit is excised from the TAB tape at a point beyond the outer lead, so that the outer lead remains attached to the bonded inner lead and integrated circuit. The integrated circuit assembly is subsequently mounted on a substrate, if this has not already been done, and the outer leads are appropriately bonded to the substrate.

In an alternative bonding method, a flexible circuit (FLEX) is used to form the electrical interconnections between the integrated circuit and the substrate, the substrate being an integral part of the flexible circuit itself. The FLEX circuit consists of a patterned arrangement of conductors on a flexible insulating base substrate with or without cover layers. The FLEX circuit may be single or double sided, multi-layered, or rigidized, in addition to other possible arrangements. The FLEX circuit may be formed by several methods, such as by laminating copper foil to any of several base substrate materials, or alternatively pattern plating copper directly onto the substrate.

The FLEX circuit is advantageous in that it contains both the internal and external integrated circuit chip interconnections. The inner leads are adjacent to and an integral part of the flexible circuitry pattern. Outer leads are not required because the individual inner leads are incorporated within the flexible circuitry pattern. In addition, the flexible circuitry pattern is supported by the flexible insulating substrate and electrically connected at the appropriate regions. Therefore outer lead bonds are not necessary and correspondingly the number of interconnections are substantially reduced. For these reasons, flexible circuitry technology has many advantages. FLEX circuitry significantly reduces the number of chip interconnections resulting in reduced lead inductance and lead-to-lead capacitance, as well as increased product reliability. In addition, the use of the FLEX circuitry permits smaller integrated circuits and interconnection patterns because the chip is mounted directly onto the patterned substrate.

Regardless of the method used for forming the electrical interconnection bond, for enhanced reliability it is desirable to control the amount of solderable surface area the bump on the integrated circuit contacts. If the solderable surface area, as defined by the conductor area and surrounding dielectric, is too large, the mass of solder which forms the bump has a propensity to sheer off during exposure to the widely varying temperature ranges. Therefore, the actual contact area between the individual solder bump on the integrated circuit and the contact region of the conductor must be optimally minimized.

Generally, the amount of contact area has been controlled and minimized by providing a conductor having a predetermined, optimal width in the contact region and by further providing a dielectric region, referred to as a solder dam, around the conductor in the contact area to prevent the solder from wicking down the conductor. The prior art has generally used a solder dam configuration which consists of a thick film of dielectric deposited over the conductor layer, wherein a trough is patterned within the dielectric layer so as to conform to the perimeter of the integrated circuit. Therefore, the trough forms a ring around the perimeter of the integrated circuit. Within the trough there is no dielectric material present. Lastly, the electrical contacts are formed between the conductors and integrated circuit within that trough region.

A significant disadvantage exists with respect to the prior art solder dam design. The alignment between the conductor layer and solder dam layer must be maintained quite strictly or substantial misalignment results between the two layers. When there is even slight misalignment between the layers, the conductors do not align with the solder dam or conductive bumps on the integrated circuit. Therefore, there may be electrical connections which are formed only partially or not at all, resulting in diminished integrity of the electrical connections and the electrical circuit as a whole.

It is therefore advantageous to provide an electrical interconnection lead comprising the conductor leads and a solder dam configuration, suitable for bonding to an integrated circuit for electrically interconnecting the integrated circuit to an electrical circuit on a substrate, which has both a high tolerance with respect to any misalignment between the components and also electrically efficient. It is further desirable that the interconnection lead have an improved solder dam configuration which permits the high tolerance for misalignment between the components. In addition, it is desirable that the provided interconnection lead be suitable for use with conventional thin and thick film technologies, tape automated bonding techniques or flexible circuitry techniques.

SUMMARY OF THE INVENTION

It is therefore an object of this invention to provide an interconnection lead suitable for bonding to an integrated circuit for electrically interconnecting the integrated circuit to an electrical circuit on a supporting substrate.

It is a further object of this invention that the provided interconnection lead be highly reliable with a high tolerance for misalignment between components.

It is still a further object of this invention to provide a solder dam configuration within the electrical interconnection lead which provides the high tolerance for misalignment between components, and which is suitable for use with either conventional thick and thin film technologies, tape automated bonding techniques or flexible circuitry techniques.

In accordance with a preferred embodiment of this invention these and other objects and advantages are accomplished as follows.

This invention comprehends an electrical interconnection lead pattern for electrically connecting an integrated circuit to an electrical circuit. The electrical interconnection lead pattern comprises a plurality of electrical conductors, each conductor having a contact region wherein the conductor is electrically connected to a predetermined region, i.e., the solder bump, on the integrated circuit. Each of the contact regions are substantially parallel with respect to each and every other contact region.

In addition, the electrical interconnection lead pattern comprises a plurality of non-continuous regions comprising a non-solderable, dielectric material, such as glass. Each of the dielectric regions are substantially parallel with respect to each and every other dielectric region; therefore, the non-continuous, open regions between each of the dielectric regions are also substantially parallel.

Lastly, each of the contact regions are substantially perpendicular with respect to each and every dielectric region, such that a portion of each of the contact regions on the conductors contacts a dielectric region and a non-continuous, open region between the dielectric regions.

This invention provides electrical conductors suitable for electrically connecting an integrated circuit to an electrical circuit which tolerates substantial misalignment between the contact regions of the conductors, the solder dam regions of the dielectric, and the contacted regions of the integrated circuit without detrimental effects to the reliability or integrity of the electrical system.

Other objects and advantages of this invention will be better appreciated from a detailed description thereof, which follows.

BRIEF DESCRIPTION OF THE DRAWINGS

The following detailed description of the preferred embodiment of the invention may be best understood when reference is made to the accompanying drawing.

DETAILED DESCRIPTION

In accordance with this invention, the shortcomings of the prior art are overcome by providing an electrical interconnection lead pattern having a unique solder dam configuration which permits high tolerance for misalignment between the solder dam regions of the dielectric, the contact regions on the electrical conductors, and the solder bumps on the integrated circuit.

This is accomplished by providing an electrical lead pattern comprising a plurality of electrical conductors and a plurality of non-continuous dielectric regions. Each conductor has a contact region wherein the conductor will be electrically connected to the solder bump, or other appropriate region, on the integrated circuit. Each of the contact regions are substantially parallel with respect to each and every other contact region. In addition, each of the dielectric regions are substantially parallel with respect to each and every other dielectric region, therefore the non-continuous, open regions between each dielectric are also substantially parallel. Lastly, each of the contact regions are substantially perpendicular with respect to each and every dielectric region, such that a portion of each of the contact regions contacts a portion of a non-continuous, open region between the dielectric regions.

This electrical interconnection lead pattern is suitable for electrically connecting an integrated circuit to an electrical circuit. The pattern provides a high tolerance for misalignment between the contact regions on the conductors and the solder dam regions of the dielectric, without detrimental effects to the integrity of the electrical connections.

Figure 1:
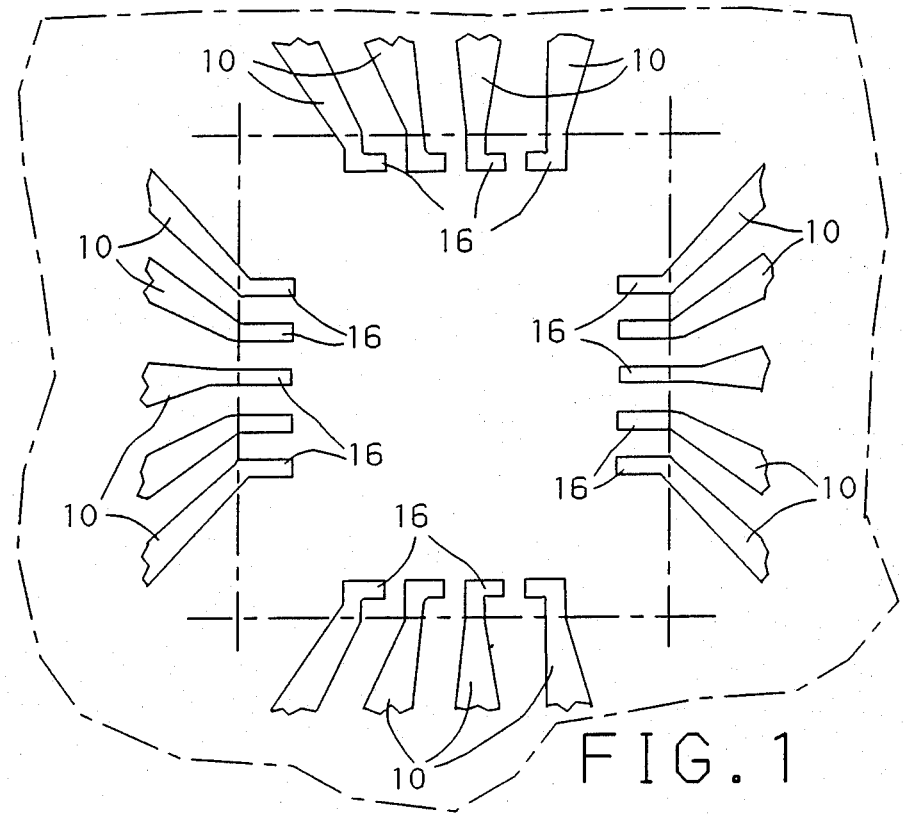
FIG. 1 is a plan view of a plurality of electrical conductors in the region where the conductors will electrically contact the integrated circuit.

In FIG. 1, an illustrative example of a thick or thin film conductor pattern in the region of the integrated circuit is shown. The conductors 10 are formed from a thick or thin film ink which has been conventionally screen printed or deposited onto the silicon, or other appropriate ceramic, substrate 12 to form the electrical wiring pattern of the electrical circuit. The conductors 10 may also have been formed using tape automated bonding (TAB) or flexible circuitry (FLEX) techniques. The conductors 10 are preferably comprised of copper, but also may be formed from silver or a palladium-silver composition. The thick film ink is both electrically conductive and solderable. If solder is subsequently placed on the conductor 10, it will spread over the conductor 10 into a thin layer unless a non-solderable surface is encountered. The dashed alignment marks 14 do not appear on the electrical circuit and therefore do not form a part of this invention; however, they are shown for purposes of understanding the advantages of this invention with respect to its high tolerance for misalignment.

A contact region 16, which is merely an extension of the conductor 10 in either a straight or angled direction, is provided on the end of each conductor 10. This is where the electrical connection will be formed between the conductor 10 and the solder ball on the integrated circuit. It is significant to note that the contact regions 16 are all substantially parallel with respect to each and every other contact region 16. With this configuration, the amount of allowable misalignment, in the direction parallel to the contact regions 16, between the conductor 10 and the subsequent overlaying solder dam is controlled by the length of the contact region 16. Preferably, the contact region 16 has a length of about twice its width, although the dimensions of the region may vary. It is desirable to keep the dimensions within this range, since too long a length is undesirable because of dimensional constraints within the packaging of the electronics and integrated circuit, and too minimal a length becomes burdensome with respect to the processing requirements.

Figure 2:
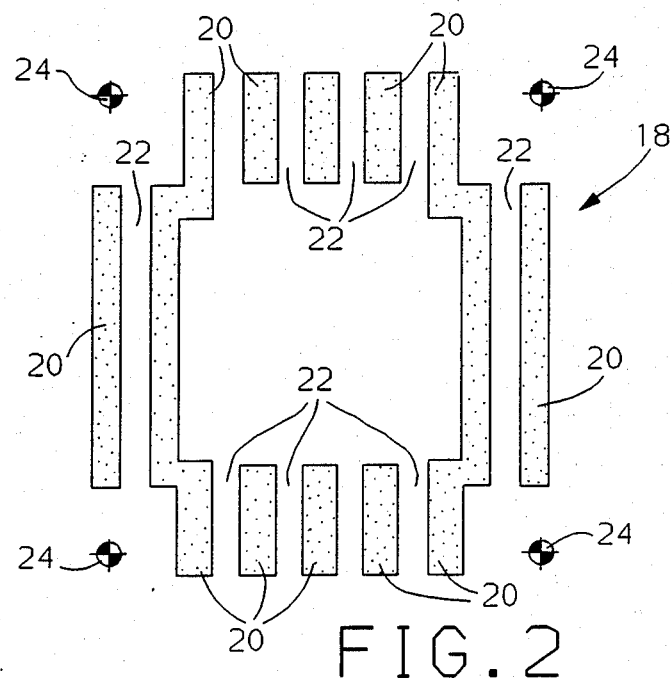
FIG. 2 is a plan view of a plurality of dielectric regions in accordance with this invention.

In FIG. 2 an illustrative example of a solder dam 18 formed in accordance with this invention is shown. The solder dam 18 is also a thick or thin film ink which is conventionally screen printed or otherwise deposited onto the surface of the substrate 12 over the conductor pattern 10. The solder dam 18 pattern comprises a plurality of non-continuous dielectric regions 20 with open regions 22 between the non-continuous regions 20. The dielectric material which forms the solder dam 18 pattern must be not only non-conductive, but also not solderable. Preferred materials are air-fired or nitrogen fired glass, such as DuPont materials #5707 which is air-fired or #4475 which is nitrogen fired. The DuPont #4475 is preferred to use with the copper films, because the nitrogen firing prevents oxidation of the copper. However, any material which meets the necessary requirements of being dielectric and non-solderable, such as an organic polymer or ultraviolet cured polymer, would also be suitable. The plurality of non-continuous dielectric regions 20 comprising the solder dam 18 form a plurality of open regions 22 wherein the underlying conductor 10 or substrate 12 material is exposed.

Note, the open regions 22 of non-continuity between the dielectric regions 20 are substantially parallel. These open regions 22 define the area wherein the electrical contacts will be formed between the integrated circuit and the conductors 10. The amount of allowable misalignment between the solder dam 18 and the contact region 16 of the conductors 10, in the direction parallel to the open regions 22, is determined by the length of the open regions 22. The length of the open regions 22 are determined by the approximate dimensions of the integrated circuit which will be electrically contacted and the dimensions of the surrounding circuitry. It is important to achieve an optimal length, since too long a length is undesirable due to the packaging constraints, and too minimal a length becomes burdensome with respect to the processing requirements. In addition, the four quartered circles 24 are shown for alignment purposes so as to better understand this invention, and do not appear on the actual solder dam 18 pattern.

Therefore, as stated above, the contact regions 14 of the conductors 10 are positioned parallel to each other and the open regions 22 separating the dielectric regions 20 of the solder dam 18 are positioned parallel to each other. The amount of allowable misalignment between the solder dam 18 print and the conductor 10 print (1) in the direction parallel to the contact regions 16 of the conductors 10 is determined by the length of the contact regions 16, and (2) in the direction parallel to the open regions 22 separating the dielectric regions 20 is determined by the length of the open regions 22. Therefore, when the contact regions 16 are disposed perpendicular to the open regions 22 of the solder dam 18, a two-dimensional tolerance for misalignment is formed, without a detrimental effect on the integrity of the resulting bonds.

Figure 3:
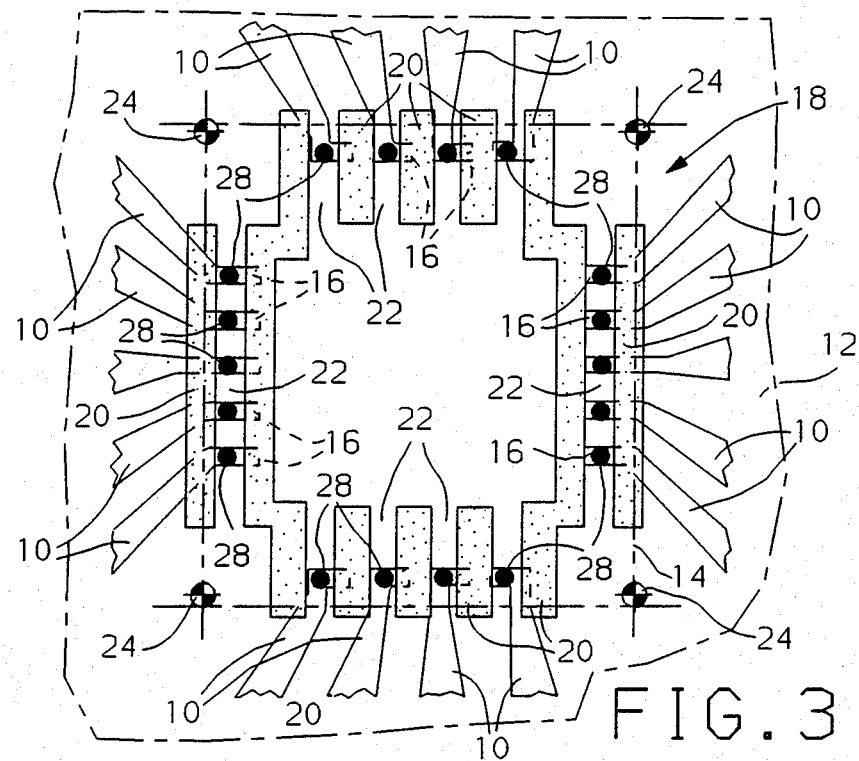
FIG. 3 is a plan view of a preferred embodiment of this invention wherein the plurality of conductors and dielectric regions are aligned.

FIG. 3 shows the position of the conductors 10, electrical connections 26 and solder dam 18 configuration when the components are aligned. (The four quartered circles 24 and dashed peripheral line 14 illustrate that the components are aligned.) The contact regions 16 of the conductors 10 are all parallel with respect to each other, but perpendicular with respect to the open regions 22 separating the dielectric regions 20 within the solder dam 18 configuration. The dark spots 28, or contact points, represent the solder bumps on the integrated circuit, therefore electrical connection between the integrated circuit and the contact regions 16 of the conductors 10 occurs at the contact points 28. The solder bumps and contact regions 16 of the conductors 10 are soldered using conventional techniques, such as soldering with lead-indium, preferably 50% lead/50% indium material.

It is important to note, that in addition to the contact regions 16 being perpendicular to the open regions 22 within the solder dam 18, the contact regions 16 must also contact the open regions 22 so that the solder can flow between the solder bump and contact region 16, but the contact region 16 must also contact the dielectric regions 20 so that the solder is prevented from flowing everywhere on the conductor 10. When the components are aligned and the solder bumps on the integrated circuit match with the contact regions 16 of the conductors 10 in the open regions 22 of the solder dam 18, the reliability and integrity of the resulting electrical connections 26 should be superb, granted there are no material flaws.

Figure 4:
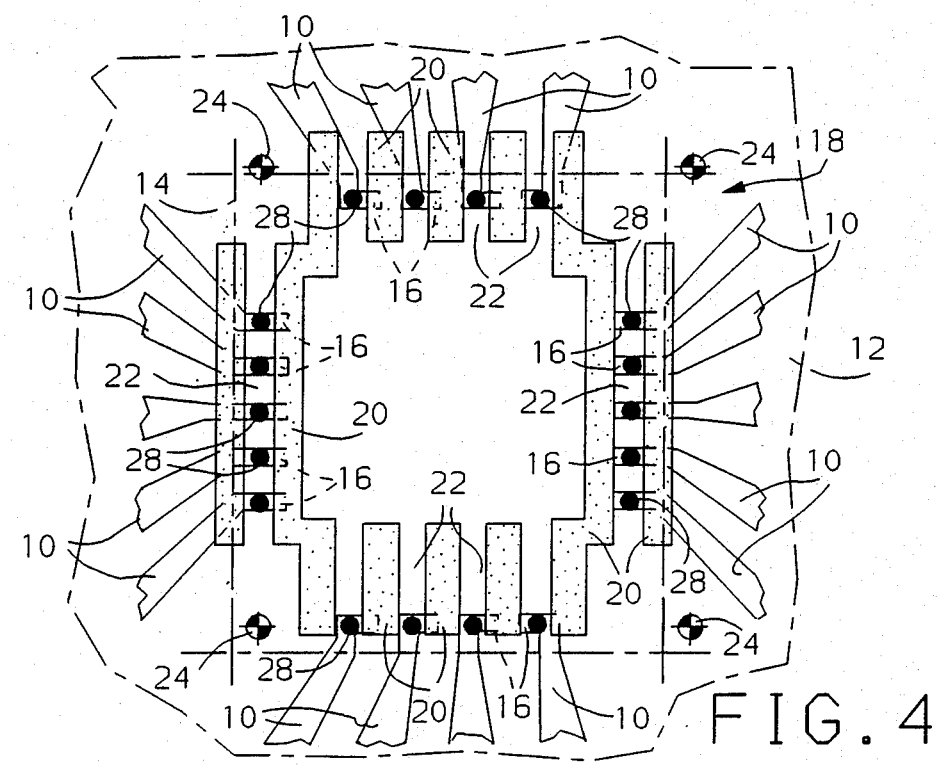
FIG. 4 is a plan view of a preferred embodiment of this invention wherein the plurality of conductors and dielectric regions are misaligned.

FIG. 4 shows the position of the conductors 10, electrical connections 26 and solder dam 18 configurations when the components are misaligned. Again, the contact regions 16 of the conductors 10 are parallel with respect to each other, but perpendicular with respect to the open regions 22 separating the dielectric regions 20 within the solder dam 18 configuration. In addition, the contact regions 16 are necessarily contacting the dielectric regions 20 and the open regions 22 separating the dielectric regions 20. As shown in FIG. 4, although there is misalignment, as evidenced by the four quartered circles 24 and dashed peripheral line 14, there is still contact at the contact points 28 between all of the solder bumps on the integrated circuit and the contact regions 16 of the conductors 10 in the appropriate open regions 22 of the solder dam 18. This is due to the two-dimensional tolerance for misalignment provided by this solder dam 18 configuration.

Figure 5:
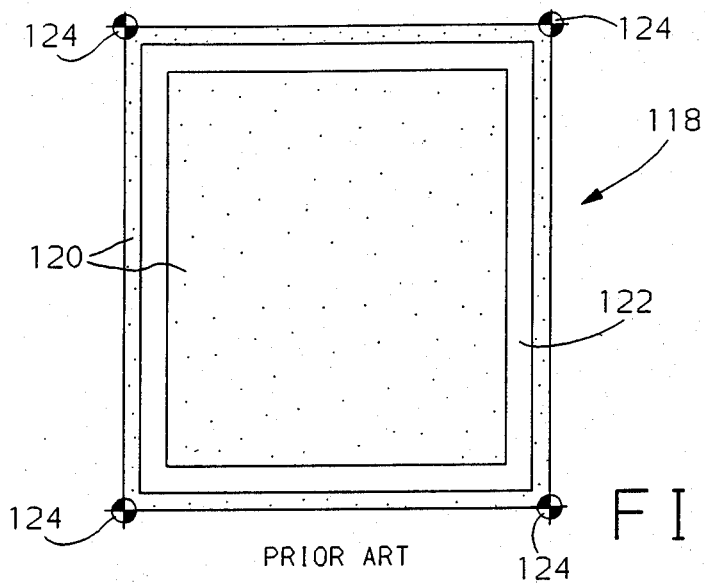
FIG. 5 is a plan view of a solder dam configuration in accordance with the prior art.
Figure 6:
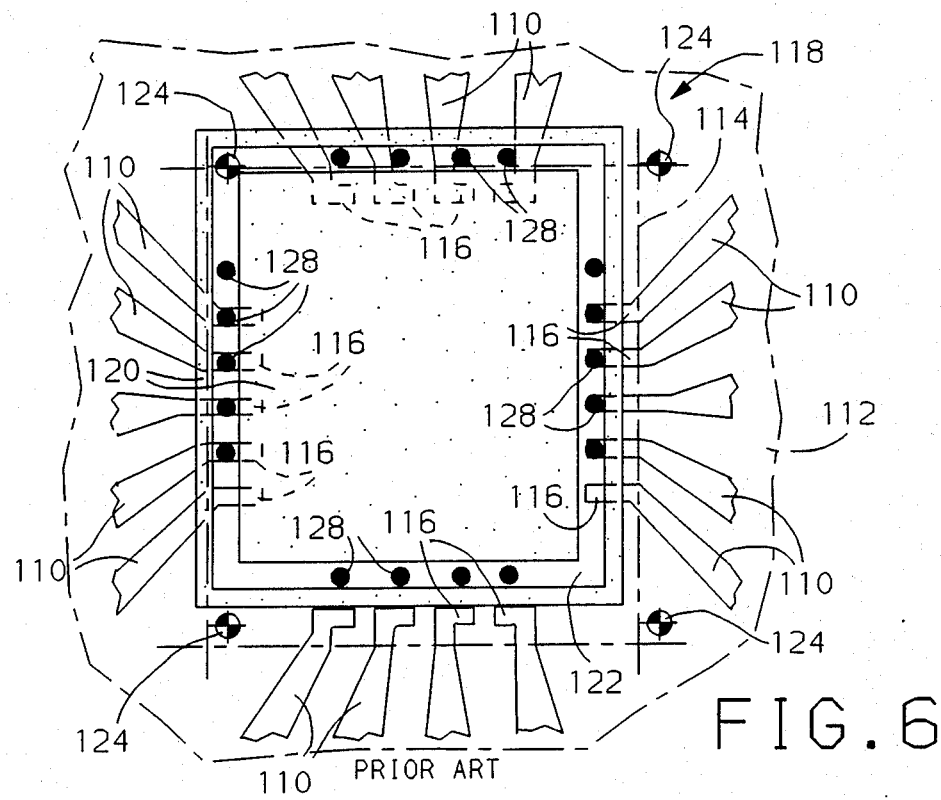
FIG. 6 is a plan view in accordance with the prior art of a plurality of electrical conductors and a solder dam wherein the electrical conductors and solder dam are misaligned.

FIGS. 5 and 6 are merely illustrative of the prior art for comparative purposes only. FIG. 5 shows the generally used solder dam 118 configuration, wherein the dielectric material 120 is deposited everywhere except a ring 122 around the perimeter of the integrated circuit. FIG. 6 shows the position of the conductors 110, electrical connections 126 and solder dam 118 configurations when the components are misaligned by the same amounts as the components in FIG. 4, as evidenced by the four quartered circles 124 and dashed peripheral line 114. Note, with the prior art solder dam 118 configuration, the contact points 128 wherein the solder bumps on the integrated circuit should contact the respective contact regions 116 on the conductors 110, do not align. In some instances the solder bumps do not match at all with the contact regions 116 of the conductors 110.

While our invention has been described in terms of preferred embodiments, it is apparent that other forms could be adopted by one skilled in the art, such as using flexible circuit technology or tape automated bonding technology and the unique solder dam configuration in accordance with this invention for bonding leads to integrated circuits. In addition, we have shown a rectangular conductor pattern having 14 conductors located around the rectangle. This invention is equally suited for integrated circuits having more or less conductors in any type of configuration. Accordingly, the scope of our invention is to be limited only by the following claims.

The embodiments of the invention in which an exclusive property or privilege is claimed are defined as follows:

1. An electrical interconnection lead pattern for electrically connecting an integrated circuit to an electrical circuit comprising:

a plurality of electrical conductors, each conductor having a contact region wherein said conductor is electrically connected to a predetermined region on the integrated circuit, each of said contact regions being substantially parallel with respect to each and every other contact region; and a plurality of non-continuous dielectric regions, each of said dielectric regions comprising a material not amenable to soldering and being substantially parallel with respect to each and every other dielectric region so that the non-continuous regions between the dielectric regions are also substantially parallel;

each of said contact regions being substantially perpendicular with respect to each and every said dielectric regions, such that a portion of each of said contact regions contacts a portion of the non-continuous region between said dielectric regions and a portion of said dielectric region;

effective to provide an electrical conductor pattern suitable for electrically connecting an integrated circuit to an electrical circuit which provides high tolerance for misalignment between said components without detrimental effects.

2. An electrical interconnection lead pattern suitable for electrically connecting an integrated circuit to an electrical circuit as recited in claim 1 wherein said conductors comprise copper.

3. An electrical interconnection lead pattern suitable for electrically connecting an integrated circuit to an electrical circuit as recited in claim 1 wherein said conductors comprise silver.

4. An electrical interconnection lead pattern suitable for electrically connecting an integrated circuit to an electrical circuit as recited in claim 1 wherein said conductors comprise palladium and silver.

5. An electrical interconnection lead pattern suitable for electrically connecting an integrated circuit to an electrical circuit as recited in claim 1 wherein said dielectric regions comprise glass.

6. An electrical interconnection lead pattern suitable for electrically connecting an integrated circuit to an electrical circuit as recited in claim 1 wherein said dielectric regions comprise ultraviolet cured polymer material.

7. An electrical interconnection lead pattern for electrically connecting an integrated circuit to an electrical circuit comprising:

a plurality of electrical conductors, each conductor having a contact region wherein said conductor is electrically connected to a predetermined region on the integrated circuit, each of said contact regions being substantially parallel with respect to each and every other contact region; and a plurality of non-continuous dielectric regions, each of said dielectric regions comprising a material not amenable to soldering and being substantially parallel with respect to each and every other dielectric region so that the non-continuous regions between the dielectric regions are also substantially parallel;

each of said contact regions being substantially perpendicular with respect to each and every said dielectric regions, such that a portion of each of said contact regions contacts a portion of the non-continuous region between said dielectric regions and a portion of said dielectric region;

effective to provide an electrical conductor pattern suitable for electrically connecting an integrated circuit to an electrical circuit which provides high tolerance for misalignment between said components without detrimental effects.

* * * * *